United States Patent [19]

Nuzzi et al.

[11] 4,425,380

[45] Jan. 10, 1984

[54] HOLE CLEANING PROCESS FOR PRINTED CIRCUIT BOARDS USING PERMANGANATE AND CAUSTIC TREATING SOLUTIONS

[75] Inventors: Francis J. Nuzzi, Freeport; John K. Duffy, Douglaston, both of N.Y.

[73] Assignee: Kollmorgen Technologies Corporation, Dallas, Tex.

[21] Appl. No.: 443,160

[22] Filed: Nov. 19, 1982

[51] Int. Cl.³ .................. B05D 5/12; B05D 3/04; B29C 17/08; B44C 1/22
[52] U.S. Cl. ..................... 427/97; 134/29; 134/22.16; 134/22.17; 156/655; 156/668; 156/902; 252/79.5; 427/98; 427/307
[58] Field of Search .............. 252/79.5; 156/638, 655, 156/668, 902; 29/852; 134/2, 22 R, 26, 29, 33; 427/96, 97, 98, 307

[56] References Cited

U.S. PATENT DOCUMENTS

| | | | |
|---|---|---|---|
| 3,141,797 | 7/1964 | Pekar et al. | 148/6.15 |
| 3,276,106 | 10/1966 | Bester et al. | 156/629 X |
| 3,276,927 | 10/1966 | Medford | 156/644 X |
| 3,425,947 | 2/1969 | Rausch et al. | 252/105 |
| 3,515,649 | 6/1970 | Hepfer | 204/38 |
| 3,647,699 | 3/1972 | Doty et al. | 252/79.2 |
| 3,652,351 | 3/1972 | Guisti | 252/79.1 X |
| 3,652,417 | 3/1972 | Posselt | 252/80 |
| 3,689,303 | 9/1972 | Maguire et al. | 204/30 X |
| 3,962,496 | 6/1976 | Leech | 427/306 |
| 4,042,729 | 8/1977 | Polichette et al. | 427/304 |
| 4,054,693 | 10/1977 | Leech et al. | 427/304 |

FOREIGN PATENT DOCUMENTS

| | | | |
|---|---|---|---|
| 812207 | 5/1969 | Canada. | |
| 7512 | 2/1894 | United Kingdom | 423/597 |
| 1479556 | 7/1977 | United Kingdom. | |

OTHER PUBLICATIONS

Bulletin De L'Academie Polonaise Des Sciences, vol. VII, No. 6, 1959, Kinetics and Mechanism of Reduction of Permanganate to Manganate by OH–Ions by B. Jezowska-Trzebiatowska et al., pp. 405–420.

Primary Examiner—William A. Powell
Attorney, Agent, or Firm—Morgan, Finnegan, Pine, Foley & Lee

[57] ABSTRACT

An improved process for removing resin smeared on an interior wall of a hole in a resinous substrate and/or adhesion promoting the substrate which comprises: (a) contacting the substrate with an alkaline permanganate treating solution having a pH between about 11 and about 13 and an elevated temperature for a time period sufficient to remove the resin smear; (b) neutralizing essentially all manganese residue on the substrate; (c) contacting the substrate with an alkaline hydroxide etchant to remove the balance of manganese residue on the substrate. A metal such as copper subsequently may be electrolessly deposited in a more efficient and easily controlled manner on the resin substrate in the formation of a wire scribed circuit board or multilayer printed circuit board. In addition to resin smear removal, the process results in an improved bond between copper and the hole wall.

26 Claims, 4 Drawing Figures

HOLE CLEANING PROCESS FOR PRINTED CIRCUIT BOARDS USING PERMANGANATE AND CAUSTIC TREATING SOLUTIONS

BACKGROUND OF THE INVENTION

1. Field of the Invention

This invention relates to an improved process of electrolessly depositing copper on an insulating substrate. This invention also relates to an improved method of removing resin smears on interior walls of holes formed in insulating substrates.

2. Description of the Prior Art

Hole forming operations in resin containing materials often result in the smearing of resin over the interior wall or barrel of a hole. This resin smear is primarily attributable to the generation or utilization of temperatures exceeding the melting point of a resinous component of the material during hole forming operations.

When holes are drilled in epoxy impregnated fiberglass laminate materials, for example, friction of the drill bit against the material raises the temperature of the bit. Numerically controlled drilling machines are in common use today, and they are capable of a very rapid drilling sequence, up to 200 holes per minute. Under these conditions, drill bit temperatures of 260° C. to 315° C. occur, and such temperatures exceed the melting temperature of many resin systems. The drill bit thus picks up melted resin on its course through the material being drilled, and this melted accretion is smeared in the barrel of the hole. In laser drilling to contact interior conductors in organic insulating substrates, a similar resin accretion or smear is developed on the exposed conductor surface.

While the resin smeared on the hole walls may be ignored in some applications, it is at times imperative that it be removed. Consider, for example, a hole that has been formed in a resin-containing material which includes a plurality of parallel planar metallic conductors, with the hole perpendicular to, and communicating with, two or more of the parallel metallic conductors, i.e., a multilayer circuit board. If it is desired to metallize the hole walls in order to form a conductive path between two or more of the metallic conductors, the resin smear must be removed from the edges of the hole through the metallic conductors if conductive contact between the metallized hole wall and the metallic conductors is to be achieved. For example, when circuit board holes are drilled through a copper clad base plastic laminate or through a plastic laminate containing internal conductor planes such as in a multilayer circuit board, resin smear on the metallic surfaces exposed to the walls of the hole(s) must be removed to achieve proper functioning of the plated through holes.

Plated through-holes as described above are useful as electrical connection between printed circuits having metallic conductors on both sides or between two or more of the various planes and surface conductor layers in multilayer boards. The electrical and mechanical integrity required for this function can only be attained by insuring complete removal of resinous materials from the entire inner circumference of the portion of the metallic conducting layer exposed by the hole.

Another instance where resin smear removal is essential is in the formation of wire assemblies according to U.S. Pat. Nos. 3,646,572; 3,674,914; and 4,097,864, all to Burr, the disclosures of which are hereby incorporated by reference. This invention is known as a wire scribed circuit board and is manufactured under the tradename Multiwire ®. Such wire assemblies may include, for example, networks of fine insulated wires affixed to a surface of a substrate. Interconnection between these wires and other conductors may be established by, for example, drilling a hole perpendicular to the wire planes of such a diameter and location that it intersects the wire, metallizing the barrel of the hole and the intersected tip of the wire, and soldering a connection to the metallized hole. If resin smears are not thoroughly removed from the hole wall and the wire tip, poor or no electrical contact between the metallized hole wall and the wire tip may result. Moreover, even if acceptable electrical contact should be initially achieved when an unclean hole is metallized, this contact may be lost in a later soldering operation due to expansion of the resin smear rupturing the physical contact between the metal hole wall and the intersected wire.

Numerous methods are known for removing resin smear. One approach is a mechanical one and involves channeling a dry or wet stream of abrasive particles through such holes. A similar method is the use of hydraulic pressure to force a thick slurry of abrasive material through the holes. Mechanical methods generally are relatively slow and difficult to control. Moreover, complete smear removal rarely is assured since good reproduceability with respect to all holes in a given circuit board is difficult to achieve.

Other methods of smear removal include the use of chemicals that attack the smeared resinous coating.

Concentrated sulfuric acid down to about 90 percent concentration has been successfully used. Smeared epoxy resin, which is usually less than about 0.001 inch thick, can be removed with about one minute's treatment with such an agent. Unfortunately, the high (92%–98%) sulfuric acid concentration required for effective smear removal also demands extraordinary precautions by operators. It produces undesirably rough hole walls. Concentrated sulfuric acid rapidly absorbs water and becomes ineffective, limiting its useful life span. Immersion time for smear removal varies with the absorbed water.

Another smear-removal agent is concentrated chromic acid. It is slower acting than sulfuric acid, requiring from five to fifteen minutes for equivalent smear removal. Operator caution and special tank linings and immersion racks are required. Increasingly strict water quality regulations and the difficulty of disposing of the concentrated chromic metal residuals in an ecologically satisfactory manner also weigh against this method of smear removal. In brief, chromic acid presents toxicity problems, difficulty of waste treatment of rinse water, and leaves chromium residues which interfere with electroless plating.

Various ratios and combinations of sulfuric and fluorine containing acids are used as smear-removal agents, but these are extremely toxic, requiring specially designed equipment.

Permanganate also has been used for smear removal for mechanical and laser drilled holes, as it does not require special equipment or extraordinary safety precautions for operators and presents little ecological hazard in waste disposal. See e.g., British Pat. No. 1,479,556 where the use of an alkaline permanganate solution having a pH of at least about 13 is disclosed. Permanganate solutions with a pH greater than 13 have been used for Multiwire ® circuit boards to remove epoxy smear from the wire and etch back polyimide insulation around the wire. The use of high pH permanganate solution results in localized inactive areas and thus formation of pin holes or plating voids when subsequently electrolessly plated.

U.S. Pat. Nos. 4,042,729 and 4,054,693 disclose the use of permanganate solutions having a pH between 11 and 13 to achieve good adhesion of metal to a resinous substrate. This pH, however, is too low to accomplish rapid polyimide removal in wire scribed discrete wiring boards with polyimide coated wires.

In the process for making a wire scribed board, permanganate treatment has been used not only to remove the smear produced by a hole drilling step, but also to etch back the polyimide wire insulation, to some extent. Following the permanganate treatment, the hole is "neutralized" and rinsed. Neutralizers such as $SnCl_2$, formaldehyde or hydrazine-hydrate solutions have been used. However, this permanganate treatment also reduces catalytic activity of the precatalyzed base material. As a result, it has been necessary to operate the electroless copper plating bath in two different modes.

In an initial mode in such prior art hole cleaning process, the copper plating bath produces sufficiently high activity to form a first copper layer. After formation of such first layer, the bath formulation is brought back to a less active and sufficiently stable condition to produce a copper deposit of adequate quality and thickness. However, the time to form the first copper layer is long. Switching between the two modes is sometimes difficult to control. And the copper plating bath can not be used on a continuous basis. This problem has been overcome by the improved hole cleaning solutions of the present invention.

Multilayer boards require a conventional seeded electroless process. This involves a separate catalysis step after hole cleaning. Another difficulty associated with multilayer processing is the formation of pin holes or plating voids in electroless plating after using very high pH permanganate hole cleaning solutions.

Hole cleaning for multilayer type boards and two-sided plated through boards has been accomplished by treating the boards with a permanganate solution, followed by neutralizing and rinsing. Since the treated boards typically are subsequently exposed to a seeding procedure, i.e. a palladium-tin-chloride solution, careful process control is, however, necessary to avoid the occurrence of "pinholes" or other plating voids. Otherwise, it is necessary to double seed or even to process twice both through the palladium-tin-chloride solution and electroless copper.

Leaving out the neutralizing step after permanganate treatment results in highly active species of permanganate residue on the substrate. Highly active permanganate residue in an electroless plating solution triggers formation of copper particles. Carrying this residue into the plating bath causes both instability and, after a relatively short use time, spontaneous decomposition of the bath.

SUMMARY OF THE INVENTION

Objects of the Invention

It is an object of this invention to provide a more efficient and easily controlled process of depositing copper on a substrate of the Multiwire ® or multilayer type.

An object of the invention is to provide an improved process of cleaning smears of resin from the inside walls of holes formed in resinous substrates without leaving undesirable residues on said walls.

It is an object of this invention to provide an improved hole cleaning process suitable for both Multiwire ® and multilayer circuit boards.

An object of this invention is to provide an improved process for manufacturing Multiwire ® circuit boards which improves reliability of the plating process and allows the use of continuously operating plating solutions.

An object of this invention is to provide an improved process for simultaneously cleaning resin smears from the inside walls of holes formed in resinous substrates and simultaneously adhesion promoting the outer layers of said substrate for adherent metal deposition.

These and other objects will become apparent from a further and more detailed description of the invention.

BRIEF SUMMARY OF THE INVENTION

This invention is based upon the discovery that there is a relationship between residual manganese left on the surface of a substrate and subsequent electroless metal deposition. Residual manganese may be detected by leaching manganese from a substrate with aqua regia and then analyzing by atomic absorption spectrometry (AAS). Large amounts of residual managanese were found when alkaline permanganate treating solutions having a pH above 13 were used. All pH values employed herein were measured at 25° C.

When a high pH permanganate solution, pH greater than 13, deposited on a substrate was not neutralized, subsequent electroless metal deposition was rapid but the electroless metal bath spontaneously decomposed. When the high pH permanganate treating solution was neutralized, residues remained on the substrate resulting in voids in the hole when a metal was subsequently electrolessly deposited thereon.

It has been found that using alkaline permanganate treating solutions having a pH between about 11 and 13 leaves less manganese in the holes and reduces the occurrence of plating voids. Subsequent hydroxide treatment further reduces residual manganese on the substrate leaving no perceptible manganese residue which otherwise would interfere with subsequent electroless metal plating. This makes it easier to absorb palladium-tin catalyst in a subsequent catalytic step and thus improves electroless plating. Hydroxide treatment also aids in the removal of resin smear, as well as particulate resinous matter such as from polyimide resins.

Briefly, this invention provides, in one aspect, a process for metallizing a resinous substrate wherein prior to the metallization, the surface of the substrate to be metallized is prepared by pretreatment comprising the following steps:

(a) contacting said substrate with an alkaline permanganate treating solution for a time period sufficient to adhesion promote the surface;

(b) contacting said substrate with a water soluble compound oxidizable by permanganate for a time period sufficient to reduce the manganese residues deposited on the substrate to a low oxidation state; and (c) contacting said substrate with an alkaline hydroxide solution at a temperature between about 40° C. and about 95° C. for a time period sufficient to remove essentially all manganese residues.

In another aspect this invention provides an improvement in a process for electrolessly depositing metal onto a multilayer circuit board having at least three conductor layers, a top layer, intermediate layer(s), and a bottom layer, the intermediate layer(s) comprised of an insulating material and a metal conductor, the circuit board having at least one hole formed therethrough, the interior walls of said hole having a resin smear thereon, where the metallic conductor of the intermediate layer(s) form part of the hole wall, the improvement which comprises:
 contacting the circuit board, prior to electroless metal deposition, with an alkaline permanganate, treating solution for a period of time sufficient to remove the resin smears;
 contacting the circuit board with a water soluble compound oxidizable by permanganate for a time period sufficient to reduce manganese residues deposited on the board to a low oxidation state; and
 removing substantially all of said manganese residues so that the surface of said circuit board is essentially free of manganese, prior to electroless metal deposition.

This invention also provides an improvement in a process for electrolessly depositing metal onto a wire circuit board having at least one insulated wire affixed to a surface of or imbedded in a substrate and at least one hole through the wire and the board, the wire portion of the interior wall of the hole having a resin smear thereon, the improvement which comprises:
 contacting the circuit board, prior to metal deposition, with an alkaline permanganate treating solution for a period of time sufficient to remove the resin smear;
 contacting the board with a water soluble compound oxidizable by permanganate for a time period sufficient to reduce the manganese residues deposited on the board to a low oxidation state; and
 removing substantially all of the manganese residues so that the surface of said circuit board is essentially free of manganese, prior to electroless metal deposition and removing polyimide insulation from the perimeter of the wire at the junction of the wire with the hole wall to expose a clean metallic wire surface.

BRIEF DESCRIPTION OF THE DRAWINGS

The invention is more fully described hereinafter with reference to the accompanying drawings which illustrate certain embodiments of the invention and together with the specification serve to explain principles of the invention. The drawings illustrate steps in forming through connections for wire scribed boards in accordance with the teachings of this invention.

FIG. 2 shows the same cross-sectional view of FIG. 1 with a hole drilled in it illustrating the resin smear.

FIG. 3 shows the hole after smear and perimeter insulation removal.

FIG. 4 shows the hole after electroless copper plating for through connections.

In more detail

Figure 1:
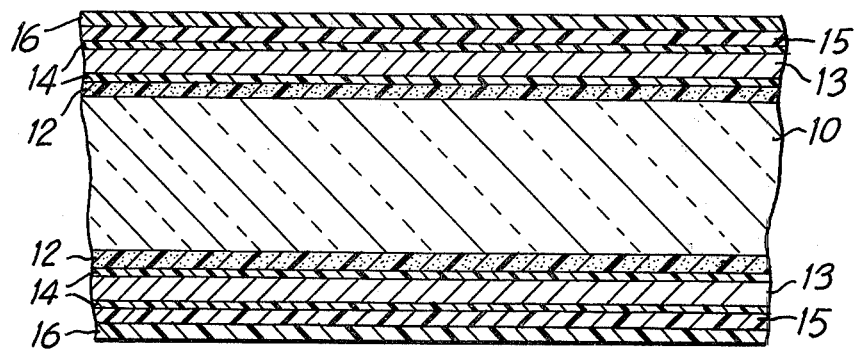
FIGS. 1-4 are cross-sectional views of a wire scribed circuit board.

FIG. 1 shows an epoxy-glass laminate 10 with adhesive layers 12 on both sides. Wire circuit patterns 13 are scribed into the adhesive layers 12. The wire has a polyimide insulation coating 14. Single sheets of glass cloth impregnated with epoxy resin 15 are bonded under heat and pressure over each of the wire circuit patterns to protect the wire pattern. A layer of polyethylene film 16, bonded by a pressure sensitive adhesive, provides a temporary mask during subsequent plating operations.

Figure 2:
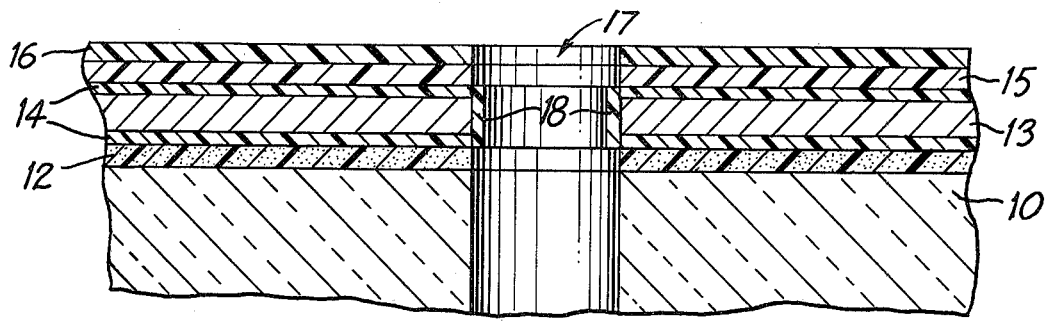
Figure 3:
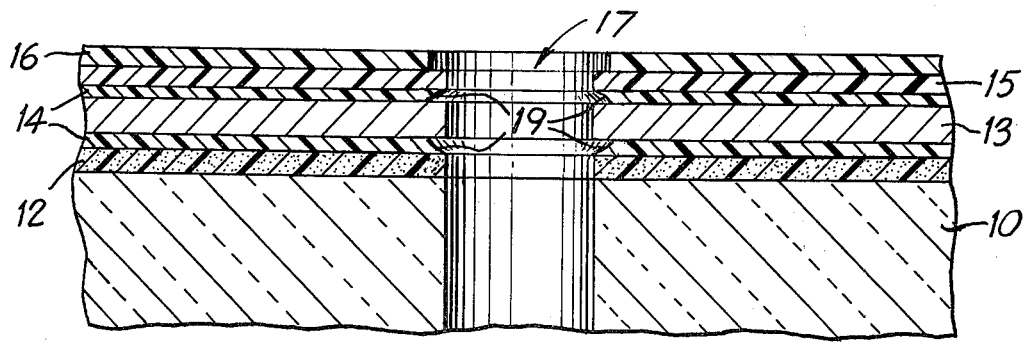

In FIG. 2, a hole 17 for a through connection is drilled in the wire scribed circuit board forming a resin smear 18. In FIG. 3, the polyethylene film 16 has been shrunk back from the edge of the hole by application of heat. The resin smear has been removed by immersion in an alkaline permanganate solution and the polyimide insulation of the wire etched back 19 by immersion in hydroxide etchant.

Figure 4:
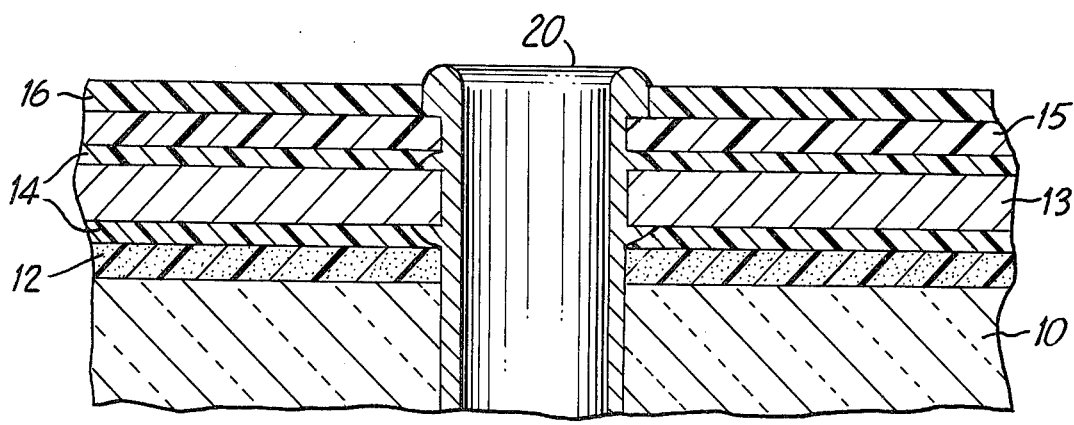

FIG. 4 shows the plated through hole. Plated copper 20 makes a secure bond to the wire 13 unimpeded by resin smear.

DETAILED DESCRIPTION OF THE INVENTION

Any metal salt of permanganic acid which is stable and soluble to the extent of at least about 10 g/l in water can be employed, but it is a preferred feature to use an alkali metal, e.g., sodium potassium, lithium or cesium, etc., or an alkaline earth metal, e.g., magnesium, and the like, permanganate salt. Especially preferred because of reach availability at reasonable cost and good solubility are sodium permanganate and potassium permanganate.

The amount of salt of permanganic acid to be employed in the solution can vary broadly, for example, from about 10 grams per liter up to the limit of solubility of permanganate in the medium. However, with sodium permanganate or potassium permanganate, especially good results are obtained in the range of from about 10 grams per liter to about 60 grams per liter. The rate of bonding sites formation increases up to about 60 grams per liter, but no further increase in rate is noted above this level. Below 10 grams per liter, the rate is somewhat too low for good production rates. As the concentration of the permanganate increases, more manganese residues remain on the substrate. Consequently, above 60 grams per liter of potassium permanganate, it is more difficult to insure complete manganese removal from the substrate.

The permanganate solution pH can be controlled by adding acids or bases as needed. A convenient method for analysis comprises (i) taking a suitably sized aliquot and cooling to the temperature of measurement, e.g., 20°-25° C.; (ii) measuring the pH with a suitable, conventional device, e.g., a pH meter; (iii) adding the pH adjustor until the pH reaches the desired level; (iv) making a note of the amount employed; and (v) then adding a proportionate amount of pH adjustor to the main bath. By way of illustration, a bath will ordinarily drop in pH due to absorption of $CO_2$ from the air, for example, to 11.5. Concentrated aqueous KOH is added dropwise to the aliquot until the pH reaches 12.5. Then the calculated amount of KOH is added to the main bath.

Oxidation resistant wetting agents, such as fluorinated hydrocarbon wetting agents, can be included in the treating composition, if desired.

Times and temperatures for the treatment step will vary and, generally, higher temperatures promote activation in shorter times. Usually, from 20 minutes to two hours, or even more can be used at temperatures of from about 35° C. to about 100° C. However, best results are obtained between about 40° C. and about 80° C. in times ranging from about 20 to about 75 minutes. Contacting can be made by immersing, dipping, spraying and similar methods applied conventionally to treat resinous surfaces.

When used herein, the term "body having a resinous surface" contemplates plastic materials, e.g. molded articles, laminated articles, resin-coated articles and the like, which are resinous in their entirety or those having at least an outwardly presented resinous surface.

A further feature of this invention comprises the use of a body having a surface comprising an adherent resinous layer, the layer having uniformly dispersed therein finely divided particles consisting of oxidizable and degradable synthetic or natural rubber. Such bases are disclosed in Stahl et al., U.S. Pat. No. 3,625,758, which is incorporated herein by reference.

Practice of the processes of this invention also requires a balancing of solution components to best effect desired relative etching where more than one resinous material is to be etched. For example, if holes in wire assemblies are to be etched, the insulated wire may have a polyimide coating, the base laminate may be an epoxy-glass laminate, and there may be a third resinous component in the form of a resinous adhesive on the surface of the base. Resin smeared in holes formed in such wire assemblies will likely be a mixture of all three resin components. Moreover, it would be desirable to etch back the polyimide insulation on the wire tip at the same time the resin smear is cleaned from the hole barrel in order to insure a firm connection between the wire tip and the metallized hole wall and avoid a simple butt joint following through-hole plating. The preferred processes of this invention are directed to the wire assembly herein described. Those skilled in the art may easily adapt the permanganate etchants disclosed to suit particular applications and resin-containing compounds.

It is desirable to effect smear removal in permanganate solutions over period of time of from about 5 to about 75 minutes, with the most preferred treatment periods ranging from about 20 to about 45 minutes.

If the longer periods are necessary for complete removal of a smear, it is preferred to treat in permanganate solution for 20 to 45 minutes; transfer the multilayer or discrete wire board to the neutralizer solution; rinse; and return to the permanganate solution for an additional 30 to 45 minutes for complete smear removal. This is believed to reduce manganese residues in the hole which slow down smear removal.

Smear removal rate increases with increasing permanganate concentration. However, residual manganese also increases with concentration. The most preferred permanganate concentration is about 45 to 60 grams/liter potassium permanganate.

The smear removal rate is directly proportional to the temperature of the treating solution, with elevated temperatures from about 40° C. to about 80° C. yielding satisfactory results. A preferred temperature is about 60° C. Operating smear-removal baths according to the present invention at temperatures significantly less than about 40° C. generally results in an unsatisfactorily slow smear-removal rate and leads to difficulty in maintaining sufficient amounts of permanganate in solution. Temperatures significantly above 60° C. do not result in any apparent advantages, i.e., the overall process is not appreciably faster.

The alkaline permanganate treating solution works best at a pH between about 11 and 14, with a preferred pH being about 12.5. Sodium or potassium hydroxide are preferred pH adjusters. All pH values herein are measured at about 25° C. If a pH of significantly less than 11 is used, the overall etch rate is decreased.

Improved smear removal is obtained by the addition of a small amount of wetting agent, such as the fluorinated hydrocarbon wetting agents. A preferred fluorinated hydrocarbon wetting agent is an anionic surfactant, potassium fluorinated alkyl carboxylate, sold under the trade names Fluorad FC128 and Fluorad FC129 by the Minnesota Mining and Manufacturing Company, St. Paul, Minn.

It is a preferred practice to follow treatment with the alkaline permanganate solution, with a neutralizing agent to "neutralize" permanganate remaining on the substrate prior to catalysis and electroless metal deposition. This neutralizer appears to aid in removing any excess permanganate from the resinous surface and prevents dilution and other possible effects due to residual strong oxidizing agent on the subsequent steps and treatment baths in the process. As neutralizers there can be used stannous ions, such as are provided in an acidified stannous chloride bath, e.g., $SnCl_2$-HCL. Also suitable are bisulfite ions, hydroxylamine hydrochloride, hydrochloric acid, formaldehyde, sugar, or, in fact, any generally recognized water soluble compound oxidizable by permanganate. To achieve the desired neutralizing effect, the permanganate treated substrate is immersed in an aqueous solution of the neutralizer, at a concentration, e.g., of from 2 grams to 100 grams per liter for a short time, followed by thoroughly rinsing the water, before the next step is carried out. Other suitable neutralizers are disclosed in U.S. Pat. No. 4,054,693 to E. J. Leech et al, the disclosure of which is incorporated by reference.

The hot hydroxide etch step of the processes of this invention employs an alkaline hydroxide. Suitable hydroxides include lithium, sodium, potassium, cesium, and tetraalkyl ammonium. The amount of hydroxide to be employed in the solution can vary broadly, for example, from about 15 to about 770 grams per liter. Optionally, complexing agents for manganese, such as ethylenedinitrilotetraacetate (EDTA), tartrates and the like can be included in the alkaline hydroxide solution.

Conventional wetting agents may be included in the alkaline hydroxide solution.

Processing time for the hydroxide etch ranges from about 10 minutes to about 30 minutes depending on concentration, and at temperatures from about 40° C. to about 90° C. Sodium hydroxide solutions at about 760 grams per liter and about 95° C. are most effective for removing manganese residues. However, because such solutions present handling difficulties, lower temperatures of about 60° C. and lower concentrations of about 150 grams per liter are preferred. The hydroxide etch may be followed by a thorough water rinse.

The two step low pH, less than 13, permanganate/hydroxide etch process offers improved process control over the current single high pH, greater than 13, permanganate solution for wire scribed circuit boards. Multiwire ® manufacture requires etch back of a polyimide insulation around a horizontal wire intersecting a vertical through hole wall. This is in addition to epoxy smear removal from the face of the wire. The rate of polyimide etch back is proportional to the hydroxide concentration of the permanganate solution. In the current one step high pH permanganate system, the hydroxide content is difficult to measure by pH electrode or simple titration. This inability to accurately measure the hydroxide content makes control of the polyimide etchback difficult. With the low pH, less than 13, permanganate/hydroxide etch system, the etch of polyimide is done in a separate hydroxide etch step. Here it is easy to measure the hydroxide concentration through a simple acid-base titration analysis since the permanganate is not present in this solution. The lower pH of the permanganate solution can be measured by a pH electrode and controlled adequately at 12.5.

Those skilled in the art of electroless metal deposition will understand that if a surface inherently is not active for the deposition of electroless metal, e.g., there is no catalyst such as palladium compound or copper oxide, etc., included in the resinous body, after pre-treatment to remove resin smears on hole walls and promote activation of bonding sites according to this invention, it will be necessary to include a step for rendering the activated surface catalytic to the reception of electroless metal, prior to contacting with the electroless metal deposition bath. There are many well-known means to render the surface catalytic. Among them are sequential processes such as by immersing the body first in a solution of stannous ions followed by immersing the so-treated body in an acidic solution of precious metal, e.g., palladium or platinum, ions. On the other hand, unitary baths may be employed for such purposes, such as the dispersions of colloidal palladium and tin ions described in Shipley, U.S. Pat. No. 3,011,920, or preferably the soluble complexes of noble metals, stannous ion and anions as described in Zeblisky, U.S. Pat. No. 3,672,938.

The thus-activated (and catalyzed, if necessary), resinous body then is metallized by electroless deposition, for instance, by depositing a nickel layer from a conventional nickel hypophosphite bath as known in the art. Instead of electroless nickel, electroless copper can be applied from a conventional copper deposition bath which contains, in addition to a reducing agent for cupric ions, a complexing agent, and other conventional ingredients. A suitable electroless copper bath may be prepared by admixing the following: $CuSO_4 5H_2O$, 10 g/l; ethylenediaminetetraisopropanol, 17 ml/l; formaldehyde (37% solution), 15 ml/l; NaCN, 30 mg/l; Pluronic P-85 (wetting agent), commercially available from BASF-Wyandotte Co., 1 mg/l; water and NaOH (to volume and pH 12.8). Other suitable electroless metal baths are described in U.S. Pat. Nos. 3,433,828; 3,485,643; 3,607,317; 3,625,758, incorporated by reference, and gold, silver, cobalt, and other electroless baths are known to those skilled in the art.

The processes of the present invention provide many advantages in control of the operating parameters. The pH of the permanganate solution is sufficiently low so that it can be measured accurately with an ordinary pH electrode and controlled with conventional electronics. The concentration of the permanganate may be measured through a spectrophotometric method at a wavelength of 525 nm, or by a potentiometric titration technique.

The potentiometric titration of the permanganate solution involves a redox potential change of a platinum electrode versus a reference electrode such as a Saturated Calomel Electrode, in a solution of the permanganate with barium ions present. A reducing agent such as sodium formate causes permanganate reduction to manganate. Manganate ion reacts with barium forming an insoluble barium manganate salt. At the equivalence point in the titration, there is an abrupt change in the redox potential of the platinum electrode.

The separate hydroxide etch step of this invention can be controlled by titrating an aliquot of the hydroxide with a standard strength acid to a neutral pH. Very tight control of the hydroxide concentration is unnecessary.

The following examples illustrate processes according to the invention.

EXAMPLE 1

Wire scribed panels were prepared by the procedures of Burr, U.S. Pat. Nos. 3,646,572, 3,674,914 and 4,097,864. A layer of glass cloth impregnated with B-staged epoxy containing catalytic filler of the type described in U.S. Pat. No. 3,600,330 by Leech et al was coated on both sides with catalytic adhesive 0.1 mm thick. This was laminated to a sheet of catalytic (FR-4) epoxy glass laminate 1.6 mm thick. Wire circuit patterns were scribed on the adhesive surface using copper wire 0.15 mm diameter coated with 0.013 mm thick polyimide insulation. After the wiring step, a layer of glass cloth impregnated with an epoxy resin containing the catalytic filler was laminated by heat and pressure over the wire scribed circuit pattern. The panels then were coated on both surfaces with a polyethylene film bonded by a pressure sensitive adhesive. Holes, 1.17 mm in diameter, were drilled through the panels intersecting and cutting through the scribed wire at points where electrical connections were to be made. Next, the resin smear, formed on the wire where the wire end forms part of the hole wall, was removed by a permanganate oxidizing solution. After removing the resin smear, the panels are normally electrolessly plated with copper through the holes. The polyethylene film prevents electroless plating on the outside surface of the panel. In this example, instead of electrolessly plating the holes, residual manganese left on the circuit board after treatment with permanganate and neutralizing solutions was measured by leaching the manganese from the board with aqua regia and then analyzing the aqua regia by Atomic Absorption Spectrophotometry. Each test contained the same known surface area of epoxy-glass hole structure, i.e. 1000 holes.

HOLE CLEANING CYCLES

The hole cleaning cycles used in this example were 1 hour at 60° C. immersion in permanganate solutions as described below, neutralization by 5 minute immersion in an aqueous solution of stannous chloride, 30 grams per liter, and hydrochloric acid, 300 milliliters per liter. This neutralization was followed by a water rinse, and only for sample 5 was the rinse followed by immersion in a hot alkaline solution of 760 grams of NaOH at 95° C. The results of varying the conditions of the permanganate/hydroxide etch cycle are shown on the table.

| | | | Atomic Absorption Analysis | |
|---|---|---|---|---|
| | | Treatment* | Mn Found In 1000 Holes | Mn Residue per Hole |
| 1. | $KMnO_4$ | 60 g/l | 0.21 mg | 0.21 μg |
| | pH | 13.6 | | |

-continued

| Treatment* | | Mn Found In 1000 Holes | Mn Residue per Hole |
|---|---|---|---|
| | fluorinated alkyl carboxylate 60° C., 60 min. | 0.2 g/l | |
| 2. | KMnO$_4$ | 15 g/l | 0.20 mg | 0.20 μg |
| | pH | 13.6 | | |
| | fluorinated alkyl carboxylate 60° C., 60 min. | 0.2 g/l | | |
| 3. | KMnO$_4$ | 60 g/l | 0.11 mg | 0.11 μg |
| | pH | 12.5 | | |
| | fluorinated alkyl carboxylate 60° C., 60 min. | 0.2 g/l | | |
| 4. | KMnO$_4$ | 15 g/l | 0.06 mg | 0.06 μg |
| | pH | 12.5 | | |
| | fluorinated alkyl carboxylate 60° C., 60 min. | 0.2 g/l | | |
| 5. | (a) KMnO$_4$ | 15 g/l | | |
| | pH | 12.6 | | |
| | fluorinated alkyl carboxylate 60° C., 60 min. | 0.2 g/l | | |
| | (b) Neutralization + Rinse | | Barely Detectable | |
| | (c) 50% NaOH, 95° C., 20 min. | | <0.01 mg | <0.01 μg |

*All KMnO$_4$ treatments were followed by neutralization and rinse.

This example shows that the prior art hole cleaning solutions at pH 13.6 leave relatively large amounts of manganese residues. Hole cleaning solutions at lower pH according to this invention leave one third to one half the manganese residues and that the alkali hydroxide solution surprisingly reduces the manganese residues to barely detectable levels.

These tests complement the electroless plating results. The higher the residual manganese content on the printed circuit the greater the difficulty for electroless copper plating. The occurence of voids in the electroless copper plating and the excessive time to initiate electroless copper plating in the Multiwire ® process was demonstrated to be related to high residual manganese content of the epoxy glass substrate. Conventional multilayer processing also finds voids even after activating with palladium catalyst after the standard high pH permanganate treatment at pH=13.6.

Use of high pH permanganate solution (pH=13.6) for hole cleaning is thought to involve formation of a manganese/resin bond at the hole wall surface:

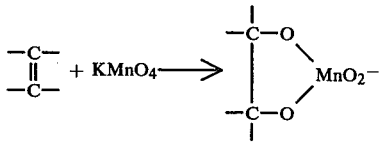

Although the exact mechanism is uncertain, it appears that this bonded manganese may then interfere with electroless copper formation on the hole wall whether a conventional palladium activation sequence (multilayer processing) or fully additive process, where the palladium is dispersed in the epoxy-resin laminate, e.g., Multiwire ®, is used.

Electroless copper bath instability will occur when boards containing residual manganese are introduced into an electroless copper bath for plating. This instability is reflected by copper particles forming in the bulk of the solution rather than on the hole wall.

This instability may occur through a manganese catalyzed parallel reaction:

| Parallel Reactions - Electroless Copper | |
|---|---|
| Normal | Manganese Catalyzed |
| $Cu^{+2} \to Cu^0$ | $Cu^{+2} \to Cu^{+1}$ |
| Hole wall | $2Cu^{+1} \to Cu^0 + Cu^{+2}$ |

In formulating the electroless copper bath for high activity to overcome the void problem associated with manganese contamination, the manganese catalyzed parallel reaction is driven at a high rate which causes instability in the electroless copper bath. High formaldehyde and high pH would be indicated to increase activity and overcome voids but in the presence of manganese contamination result in unstable plating baths.

EXAMPLE 2

The procedure of example 1 was repeated except that only one cleaning solution was used; potassium permanganate, 60 g/l; pH 13.6 and fluorinated alkyl carboxylate (FC-128), 0.2 g/l. The immersion time in the hole cleaning solution was only 30 minutes. After neutralization and rinsing, one panel was immersed 20 minutes in 760 gram per liter NaOH solution at 95° C. and one was not. Bath panels were then soaked in aqua regia to strip out manganese residues, and the aqua regia solution was analyzed for manganese. The analysis showed that the sample panel that did not receive sodium hydroxide solution contained 0.10 mg of manganese and the sample that was immersed in sodium hydroxide solution contained only 0.04 milligrams of manganese.

EXAMPLE 3

This example illustrates the application of the process of this invention to a multilayer circuit board. The board had top and bottom layers of copper each 35 micrometers thick and six inner layers of etched copper patterns each etched copper layer 35 micrometers thick. The copper layers were separated by a glass reinforced epoxy material 100 to 150 micrometers thick. This circuit board was prepared by standard laminating techniques. There were through holes in the multilayer board about 1 millimeter in diameter. Microscopic examination of the cross-sectional area of several holes revealed smears of resin caused by drilling on the hole walls including the copper layers. The multilayer board with through holes was treated to remove resin smears and metallized by the following process:

1. Immerse board for 20 minutes at 65° C. with agitation of the work piece in a solution comprising:

| Potassium permanganate | 45 g/l |
|---|---|
| Fluorinated alkyl carboxylate (Fluorad FC-129) surfactant | 0.4 ml/l |
| Sodium hydroxide to pH | 12.8 |

2. Neutralize for 3 minutes at ambient temperature with agitation of the work piece in a solution comprising:

| Sodium bisulfite | 20 g/l |
|---|---|
| Sulfuric acid to pH | 4.5 |

3. Further neutralization for 3 minutes at ambient temperature with agitation of the work piece in a solution comprising:

| Sodium bisulfite | 20 g/l |
|---|---|
| Sulfuric acid to pH | 4.5 |

4. Rinse in ambient running water for 5 minutes.
5. Immerse the board for 20 minutes at 60° C. with agitation of the work piece in a solution comprising:

| Sodium hydroxide | 150 g/l |
|---|---|
| Paranonylphenoxypolyglycidol surfactant | 1 g/l |

6. Rinse in ambient running water for 5 minutes.
7. Bake the board in an oven for 1 hour at 120° C. to remove moisture.
8. Immerse the board in an aqueous conditioner for 6 minutes at 60° C. with agitation of the work piece. This solution contains a combination of cationic surfactant, nonionic surfactant and an alkanolamine at pH <4.
9. Rinse in ambient running water for 5 minutes.
10. Immerse for 1 minute at ambient temperature with agitation of the work piece in a mild copper etching solution comprising:

| Sodium persulfate | 60 g/l |
|---|---|
| Sulfuric acid to pH | 2.5 |

11. Rinse in ambient running water for 5 minutes.
12. Immerse the board for 1 minute at ambient temperature with agitation of the work piece in a deoxidizing solution comprising:

| Water | 900 ml/l |
|---|---|
| Sulfuric Acid | 100 ml/l |

13. Rinse in ambient running water for 5 minutes.
14. Immerse for 3 minutes at ambient temperature in an acidic solution of tin chloride dissolved in a sodium chloride brine.
15. Immerse for 10 minutes at 40° C. with agitation of the work piece in a palladium-tin-chloride catalyst solution. The catalyst solution was made by adding 30 ml of the solution prepared according to Example 1 of U.S. Pat. No. 3,961,109 to 970 ml of a 20% sodium chloride brine.
16. Rinse in ambient running water for 5 minutes.
17. Immerse for 2 minutes at ambient temperature with agitation of the work piece in dilute aqueous fluoroboric acid solution.
18. Rinse in ambient running water for 5 minutes.
19. Immerse for 30 minutes at ambient temperature with agitation of the work piece in an electroless copper bath comprising:

| Ethylenediamine tetra 2-propanol | 17 g/l |
|---|---|
| Copper sulfate pentahydrate | 9 g/l |
| Formaldehyde (37%) | 20 ml/l |
| Sodium hydroxide | 22 g/l |
| Sodium cyanide | 0.01 g/l |
| Sulfurated potash | 0.8 mg/l |
| 2-Mercaptobenzothiazole | 0.08 mg/l |
| A block copolymer of ethylene oxide and propylene oxide (commercially available as Pluronic P-85 from BASF-Wyandotte Corp., Wyandotte, Mich.) | 0.001 g/l |

The electroless plating solution deposited 2 micrometers of copper on the hole walls and copper surfaces. After rinsing, the multilayer board was oven dried and copper electroplated by standard techniques to produce a total thickness of 30–35 micrometers of copper on the hole wall.

The top and bottom copper layers then were provided with a conventional resist image and the outer layer circuit patterns etched by conventional means.

The resulting multilayer board had smooth hole walls without epoxy residues or smears on the copper innerlayers and exhibited a completely void-free copper deposit. the joint between the plated copper and the foil layers was excellent.

EXAMPLE 4

This example illustrates the application of the invention to a polyimide-glass multilayer circuit. This circuit board had top and bottom layers of copper each 35 micrometers thick and six inner layers of copper each 35 micrometers thick. The copper layers were separated by a glass reinforced polyimide material 100–150 micrometer thick. Between the polyimide-glass layers and the copper layers was a very thin layer of an acrylate resin which was used to bond the polyimide glass material to the copper. Holes were drilled in the multilayer board about 1 millimeter in diameter. Microscopic examination revealed residues on the copper layers which were thought to be the acrylate adhesive resin, or adhesive plus polyimide.

This board was cleaned and metallized according to example 3. The resulting multilayer board had smooth hole walls, which were free of residues and show no evidence of voids or unplated areas. There was an excellent joint between the plated copper and the copper foil layers.

EXAMPLE 5

This example illustrates the need for the alkali treatment to remove manganese residues from the hole walls of epoxy-glass multilayer boards processed according to the present invention.

A series of epoxy-glass multilayer boards having two outer copper layers and two etched pattern inner copper layers, each 35 micrometers thick, with the copper layers separated by 450 micrometer thick epoxy-glass layers, where cleaned and metallized according to the process described in example 3.

The resulting multilayer hole walls were free of epoxy residues, smears, and voids, and had an excellent joint between the plated copper and the copper foil layers.

A second series of multilayer boards, identical to the first, were processed through all the steps of the procedure in example 3, except steps 5 and 6. A significant number of multilayer hole walls exhibited small void areas even though there were no epoxy residues or smears and the joint between the plated copper and the copper foil was good. In a production multilayer shop these boards would have to be reprocessed to deposit copper in the void areas. This result indicates the need for the alkali treatment in this process.

EXAMPLE 6

This example shows the use of a complexing agent in the alkaline hydroxide. Wire scribed circuit boards were prepared as described in example 1 by laminating adhesive, wire scribing, laminating epoxy-glass cloth, coating with polyethylene film and drilling. The hole cleaning processes were:

1. One hour immersion in aqueous solution of potassium permanganate, 60 g/l and a fluorinated alkyl carboxylate (Fluorad 128), 0.2 g/l at pH 12.5 and 60° C.
2. Three minute immersion in a 30 g/l stannous chloride neutralizer as described in example 1.
3. Three minute immersion in a 3 g/l stannous chloride neutralizer.
4. Rinse for 5 minutes.
5. Immersed for 30 minutes at 45° C., in the following solution:

| | |
|---|---|
| Sodium potassium tartrate | 100 g/l |
| Sodium hydroxide | 120 g/l |
| A fluorinated alkyl carboxylate (Fluorad FC-128) | 0.2 g/l |
| An ethylene oxide polymer (commercially available as Polyox Coagulant from Union Carbide Corp., Danbury, CT) | 2 mg/l |

6. Rinse 5 minutes.
7. Electroless copper plate in the following solution:

| | |
|---|---|
| Copper | 0.04 mol/l |
| Ethylenediamine tetra 2-propanol (complexing agent) | 0.06 mol/l |
| Formaldehyde | 0.07 mol/l |
| Sodium cyanide stabilizer | 0.006 mol/l |
| Sulfur stabilizer | 3$\mu$ mol/l |
| Phosphate ester surfactant | 0.15 mg/l |
| An ethylene oxide polymer (Polyox Coagulant) | 1 mg/l |
| Temperature 62° C. | |
| pH 12.7 | |

Eight hours plating deposited a uniform copper layer in the hole 50 $\mu$m thick with good adhesion to the wire ends.

EXAMPLE 7

This example illustrates the application of the process of this invention to a four layer multilayer circuit board. The board has a top and a bottom layer and two intermediate layers of copper and intervening layers of an epoxy-glass material. The multilayer board has holes drilled therethrough containing a resin smear on the interior wall of the hole and is metallized by the following procedure:

A. Immerse the board for 1 hour at 60° C. with agitation in a solution comprising:
  $KMnO_4$, 60 g/l
  NaOH to pH=12.5

The printed circuits are held in a vertical plane in a rack while immersed in processing chemicals. Horizontal motion then is maintained by displacing the rack 2 to 3 inches back and forth in the horizontal direction approximately 15 to 20 cycles per minute.

B. Neutralize for 5 minutes at 20°–25° C. with agitation in a solution comprising:
  $SnCl_2.2H_2O$, 30 g/l
  Conc. HCl (37%), 300 ml/l C. Running water rinse, 5 minutes at 20°–25° C.

D. Immerse for 20 minutes at 60° C. with agitation in a solution comprising
  NaOH, 150 gl/l E. Running water rinse for 2 minutes.

F. Deoxidize for 3 minutes in a solution comprising
  $H_2SO_4$, 180 g/l

G. Running water rinse, 1 minute at 20°–25° C.

H. Immerse for 10 minutes in a sensitizer solution comprising:
  Palladium chloride—1 g/l
  Stannous chloride—60 g/l
  Con. HCl (37%)—100 g/l
in the form of a palladium chloride—stannous chloride complex (U.S. Pat. No. 3,672,938).

I. Rinse with water.

J. Immerse in an electroless copper bath at 55° C. e.g. U.S. Pat. No. 3,672,986 example 7, for 50 hours to deposit electroless copper about 1 mil thick.

K. Air dry.

The circuit patterns are produced on the outer layers by conventional resist printing and etching techniques.

The joint of electroless copper to the four copper layers is sound and there are no voids in the electroless copper plated on the hole walls.

It is obvious that an additive multilayer can be made by substituting an adhesive layer as described by Stahl et al., U.S. Pat. No. 3,635,758 for the top and bottom layers of copper. Optionally the board could be dried and resist image applied after step I which would eliminate the necessity to etch the outer circuit patterns.

In another additive multilayer process the epxoy glass material may contain a catalyst as described by Leech et al., U.S. Pat. No. 3,600,330 and the adhesive surface layers also contain a catalyst. Then step H can be eliminated and proceed with electroless plating after resist imaging.

EXAMPLE 8

The procedure in example 7 is repeated substituting instead of the permanganate

| in (A) | KMnO$_4$ | 15 g/l |
| --- | --- | --- |
| in (D) | NaOH | 770 g/l |
| | at 90° C. for 20 minutes. | |

Void free copper deposits are obtained with excellent adhesion of plated to the copper inner layers.

EXAMPLE 9

The procedure in example 6 was repeated substituting instead of steps 2 and 3 the following: still water rinse for 1 min., then immerse in a solution comprising:
Hydroxylamine hydrochloride—50 g/l
Concentrated HCl (37%)—20 ml/l
Also, in step 5, no sodium potassium tartrate was used. This illustrates the use of a different neutralizng solution.

EXAMPLE 10

The procedure in example 7 is repeated substituting instead of step (D) the following:
Immerse for 20 minutes at 60° C. comprising
KOH—150 g/l
Equivalent plating quality is obtained.

EXAMPLE 11

The procedure in example 7 was repeated substituting instead of step (B) the following:
Immersion for 5 minutes in a solution at 20°-25° C. comprising

| NaHSO$_3$ | 30 g/l |
| --- | --- |
| pH = 4.5 | |

This is another example of a different neutralizing solution.

EXAMPLE 12

The procedure in example 7 is repeated substituting instead of step (D) the following:

| LiOH | 150 g/l |
| --- | --- |
| | at 60° C. for 20 min. |

Equivalent results are obtained.

EXAMPLE 13

The procedure in example 7 is repeated substituting instead of step (A) the following:

| NaMnO$_4$ | 60 g/l |
| --- | --- |
| | NaOH to pH = 12.5 |
| | 60° C. for 1 hour |

Equivalent results are obtained.

EXAMPLE 14

The procedure in example 6 was repeated substituting instead of step 5 the following:

| tetramethylammonium hydroxide |
| --- |
| 10% solution |
| 60° C. for 40 minutes |

Equivalent results were obtained.

EXAMPLE 15

The procedure in example 7 is repeated substituting instead of step (A) the following:

| KMnO$_4$ | 60 g/l |
| --- | --- |
| K$_2$CO$_3$ | 40 g/l |
| | KOH to pH = 12.5 |
| | 60° C. for 1 hour |

Equivalent results are obtained.

What is claimed is:

1. A process for preparing a resinous substrate for subsequent metallization which process comprises the following steps:
   a. contacting said substrate with an alkaline permanganate treating solution for a time period sufficient to adhesion promote the surface;
   b. contacting said substrate with a water soluble compound oxidizable by permanganate for a time period sufficient to reduce the manganese residues deposited on said substrate to a low oxidation state; and
   c. contacting said substrate with an alkaline hydroxide solution at a temperature between about 40° C. and about 95° C. for a time period sufficient to remove essentially all of said manganese residues.

2. A process as defined as claim 1 wherein said alkaline permanganate treating solution has a pH between about 11 and about 14.

3. A process as defined in claim 2 wherein said pH is between about 12 and about 13.

4. A process as defined in claim 2 wherein said alkaline permanganate treating solution has a permanganate concentration from about 10 grams/liter to saturation.

5. A process as defined in claim 4 wherein said permanganate concentration is between about 10 and about 60 grams/liter.

6. A process as defined in claim 1 wherein said water soluble compound oxidizable by permanganate comprises tin chloride, sodium bisulfite, hydrochloric acid or hydroxylamine hydrochloride.

7. A process as defined in claim 1 wherein said alkaline hydroxide solution is a hydroxide selected from an alkali metal hydroxides or tetraalkyl ammonium hydroxide.

8. A process as defined in claim 7 wherein said hydroxide is sodium hydroxide.

9. A process as defined in claim 8 wherein the concentration of said sodium hydroxide is between about 15 g/l and about 770 g/l.

10. A process as defined in claim 9 wherein the concentration is between about 40 g/l and about 400 g/l.

11. A process as defined in claim 10 wherein the concentration is between about 100 g/l and about 200 g/l.

12. A process as defined in claim 1 wherein said alkaline permanganate treating solution contains from about 0.01 to about 0.2 grams/liter of a wetting agent.

13. A process as defined in claim 12 wherein said wetting agent is a fluorinated hydrocarbon.

14. A process as defined in claim 1 further including a rinsing step after step b.

15. A process as defined in claim 1 further including a rinsing step after step c.

16. A process as defined in claim 1 wherein said contacting time in step c is between about 2 and about 60 minutes.

17. A process as defined in claim 1 wherein in step a said substrate is agitated at a rate from about 0 to about 20 feet per minute horizontally.

18. In a process for preparing a resinous substrate for subsequent metallization which process includes contacting said substrate with an alkaline permanganate treating solution for a time period sufficient to adhesion promote the surface; the improvement which comprises contacting said substrate with an alkaline hydroxide solution at a temperature between about 40° C. and about 95° C. for a time period sufficient to remove essentially all of said manganese residues.

19. In a process for metallizing a multilayer circuit board having at least three layers, a top, at least one intermediate, and a bottom layer, said intermediate layer being comprised of an insulating material and a metal conductor, said board having at least one hole, wherein resin is chemically removed from the interior wall of said hole by pretreatment, comprising the following steps:
(a) contacting said circuit board with an alkaline permanganate treating solution for a time period sufficient to remove resin from the interior walls of said hole;
(b) contacting said circuit board with a water soluble compound oxidizable by permanganate for a time period sufficient to reduce the manganese residues deposited on said circuit board to a low oxidation state;
(c) rinsing said circuit board with an aqueous solution; and
(d) contacting said circuit board with an alkaline hydroxide solution at a temperature between about 40° C. and about 95° C. for a time period sufficient to remove essentially all manganese residues.

20. In a process for metallizing the surface and holes of a multilayer circuit board having at least three layers, a top, at least one intermediate, and a bottom layer, said intermediate layer being comprised of an insulating material and a metal conductor, the circuit board having at least one hole formed therethrough, the interior wall of said hole having a resin smear thereon, wherein prior to said metallization, the board is subjected to pretreatment comprising the following steps:
contacting the circuit board with an alkaline permanganate solution for a time sufficient to remove resin from the board;
contacting the board with a water soluble compound oxidizable by permanganate for a time period sufficient to reduce the manganese residues deposited on the board to a low oxidation state;
contacting the board with an alkaline hydroxide solution at a termperature between about 40° C. and about 95° C. for a time period sufficient to remove essentially all manganese residues.

21. In a process for electrolessly depositing metal onto a multilayer circuit board having at least three layers, a top, an intermediate, and a bottom layer, said intermediate layer being comprised of an insulating material and a metal conductor, the circuit board having at least one hole formed therethrough, the interior walls of said hole having a resin smear thereon, wherein prior to said electroless metal deposition, which includes the steps of activating the surface of the board by depositing thereon a solution containing a noble metal, and then electrolessly depositing a metal on the activated surface and holes of the board, the board is subjected to pretreatment comprising the following steps:
contacting the board with an alkaline permanganate treating solution for a time period sufficient to remove resin from the board;
contacting the board with a water soluble compound oxidizable by permanganate for a time period sufficient to reduce the manganese residues deposited on the board to a low oxidation state; and
contacting said circuit board with an alkaline hydroxide solution at a temperature between about 40° C. and about 95° C. for a time period sufficient to remove essentially all manganese residues.

22. In a process for metallizing a discrete wire circuit board having at least one polyimide insulated wire affixed to a surface of or imbedded in a substrate and at least one hole through the wire and the board, the wire portion interior wall of the hole having exposed metal surfaces with resin smear thereon, the improvement which comprises:
contacting the circuit board, prior to metal deposition, with an alkaline permanganate treating solution for a period of time sufficient to remove resin from the board;
contacting the board with a water soluble compound oxidizable by permanganate for a time period sufficient to reduce the manganese residues deposited on the board to a low oxidation state; and
contacting the board with an alkaline hydroxide solution at a temperature between about 40° C. and about 95° C. for a time period sufficient to remove essentially all manganese residues prior to electroless metal deposition, and removing polyimide insulation from the perimeter of the wire at the juncture of the wire with the hole wall to expose a clean metallic wire surface.

23. In a process for metallizing a circuit board having at least one conductor imbedded therein and at least one hole in the board contacting the conductor, the conductor having a resin smear thereon, the process including treating the circuit board with an alkaline permanganate solution having a pH between about 11 and about 13 to remove said resin smear from the conductor contacting the hole, the improvement which comprises contacting the circuit board with an alkaline hydroxide solution at a temperature between about 40° C. and about 95° C. for a time period sufficient to remove manganese residues from the surface and holes of the circuit board, prior to said metallization.

24. In a process for metallizing a discrete wire circuit board having at least one insulated wire affixed to a surface of a substrate or imbedded therein and at least one hole in the board intersecting the wire, the wire having a resin smear thereon, the process including treating the circuit board with an alkaline permanganate solution having a pH between about 11 and about 13 to remove said resin smear from the wire intersecting the hole wall, the improvement which comprises contacting the circuit board with an alkaline hydroxide solution at a temperature between about 40° C. and about 95° C. for a time period sufficient to remove manganese residues from the surface and holes of the circuit board, prior to said metallization.

25. In a process for electrolessly depositing metal on a discrete wire circuit board having at least one insulated wire affixed to a surface of a substrate or imbedded therein and at least one hole through the wire and board, the interior wall of said hole having a resin smear thereon, wherein the interior wall of the hole and the intersected tip of the wire are metallized by electroless deposition, wherein said electroless metal deposition includes conditioning the surface of the circuit board to accept and hold a metal deposit by immersing the board in an alkaline permanganate treating solution, neutralizing permanganate on the board, activating the surface of the board by depositing thereon a solution containing a noble metal, and then electrolessly depositing a metal on the activated surface of the board, the improvement in said process which insures a good conductive joint between the tip of an intersected wire and the wall of a hole in the board intersecting the wire comprising:

contacting, subsequent to the neutralizing step and prior to the activating step, the circuit board with an alkaline hodroxide solution at a temperature between about 40° C. and about 95° C. for a time period sufficient to remove essentially all manganese residues from the surface of the circuit board.

26. A process for metallizing an insulating resinous substrate containing at least one internal metallic conductor and at least one hole wherein the surface of the substrate is prepared for adherent metal deposition and resin smear or resin residue is removed from the intersection of the conductor with the hole, comprising:

a. contacting the substrate in an alkaline permanganate treating solution for a period of time sufficient to remove said resin smear or residue from the intersection of the conductor with the hole, and to adhesion promote the surface;

b. contacting the board with a water soluble compound oxidizable by permanganate for a time period sufficient to reduce the manganese residues deposited on said substrate to a low oxidation state; and c. contacting said substrate with an alkaline hydroxide solution at a temperature between about 40° C. and 95° C. for a time period sufficient to remove essentially all of said manganese residues.

* * * * *

UNITED STATES PATENT AND TRADEMARK OFFICE
CERTIFICATE OF CORRECTION

PATENT NO. : 4,425,380

DATED : January 10, 1984

INVENTOR(S) : John K. Duffy, Douglaston; Francis J. Nuzzi, Freeport,

It is certified that error appears in the above-identified patent and that said Letters Patent is hereby corrected as shown below:

On the title page;

The inventors are listed in reverse order in the subject U.S. patent. John K. Duffy should be the first listed inventor.

At column 21, line 22 "hodroxide" should read -- hydroxide --.

Signed and Sealed this

Twentieth Day of March 1984

[SEAL]

Attest:

GERALD J. MOSSINGHOFF

Attesting Officer

Commissioner of Patents and Trademarks